United States Patent [19]

Miyagawa et al.

[11] Patent Number: 6,089,880
[45] Date of Patent: Jul. 18, 2000

[54] ELECTRIC CONNECTOR ARRANGEMENT

[75] Inventors: Isao Miyagawa, Kariya; Takashi Koumura, Toyota, both of Japan

[73] Assignee: Denso Corporation, Kariya, Japan

[21] Appl. No.: 08/965,186

[22] Filed: Nov. 6, 1997

[30] Foreign Application Priority Data

Nov. 28, 1996 [JP] Japan .................................. 8-318022
Feb. 28, 1997 [JP] Japan .................................. 9-046014
Apr. 10, 1997 [JP] Japan .................................. 9-092414

[51] Int. Cl.$^7$ ........................................ H01R 9/09
[52] U.S. Cl. ........................ 439/82; 439/84; 439/741; 439/870
[58] Field of Search ........................ 439/77, 80, 84, 439/81, 82, 83, 839, 862, 870, 871, 872, 59, 62, 249, 741

[56] References Cited

U.S. PATENT DOCUMENTS

| | | | |
|---|---|---|---|
| 3,479,634 | 11/1969 | Pritulsky | 339/17 |
| 3,613,043 | 10/1971 | Scheller et al. | 339/17 C |
| 4,640,561 | 2/1987 | George . | |
| 5,064,379 | 11/1991 | Ryll et al. | 439/81 |

FOREIGN PATENT DOCUMENTS

| | | |
|---|---|---|
| 057 757 | 8/1982 | European Pat. Off. . |
| 492 479 A2 | 7/1992 | European Pat. Off. . |
| 527 243 A1 | 2/1993 | European Pat. Off. . |
| 41 09 519 A1 | 9/1992 | Germany . |
| 5082078 | 11/1993 | Japan . |
| 6-341865 | 12/1994 | Japan . |
| 8-152438 | 6/1996 | Japan . |

*Primary Examiner*—Ren Yan
*Attorney, Agent, or Firm*—Pillsbury Madison & Sutro LLP

[57] ABSTRACT

An electric connector arrangement for connecting two electric devices comprises a male terminal fixed to a first electric device and extending therefrom toward a second electric device. A circuit board is fixed to the second electric device and has an insertion opening and at least one slit. A female terminal receives the male terminal therein, the female terminal having a body portion adapted to be inserted into the insertion opening and comprising an elastic female contact for receiving the male terminal. At least one deformable connecting element extends away from a top portion of the body portion, each deformable element having a distal end tip extending below the body portion and adaptable to be inserted into one of the slits in the second electric device. As the female terminal approaches the insertion opening, each of the distal end tips are inserted into one of the slits, and as the female terminal is further forced into the insertion opening, each of deformable connecting element deforms into a U-shape without applying stress to the body portion.

7 Claims, 11 Drawing Sheets

ELECTRIC CONNECTOR ARRANGEMENT

CROSS REFERENCE TO RELATED APPLICATION

The present application is based on and claims priority from Japanese Patent Applications Hei 8-318022 filed on Nov. 28, 1996 and Hei 9-46014, filed on Feb. 28, 1996, the contents of which are incorporated herein by reference.

BACKGROUND OF THE INVENTION

1. Field of the Invention

The present invention relates to an electric connector arrangement for connecting two electric devices or circuits, particularly, devices or circuits in vehicles used, for example, in a speedometer, an engine tachometer, a fuel gauge, or a coolant temperature gauge.

2. Description of the Related Art

Figure 15:
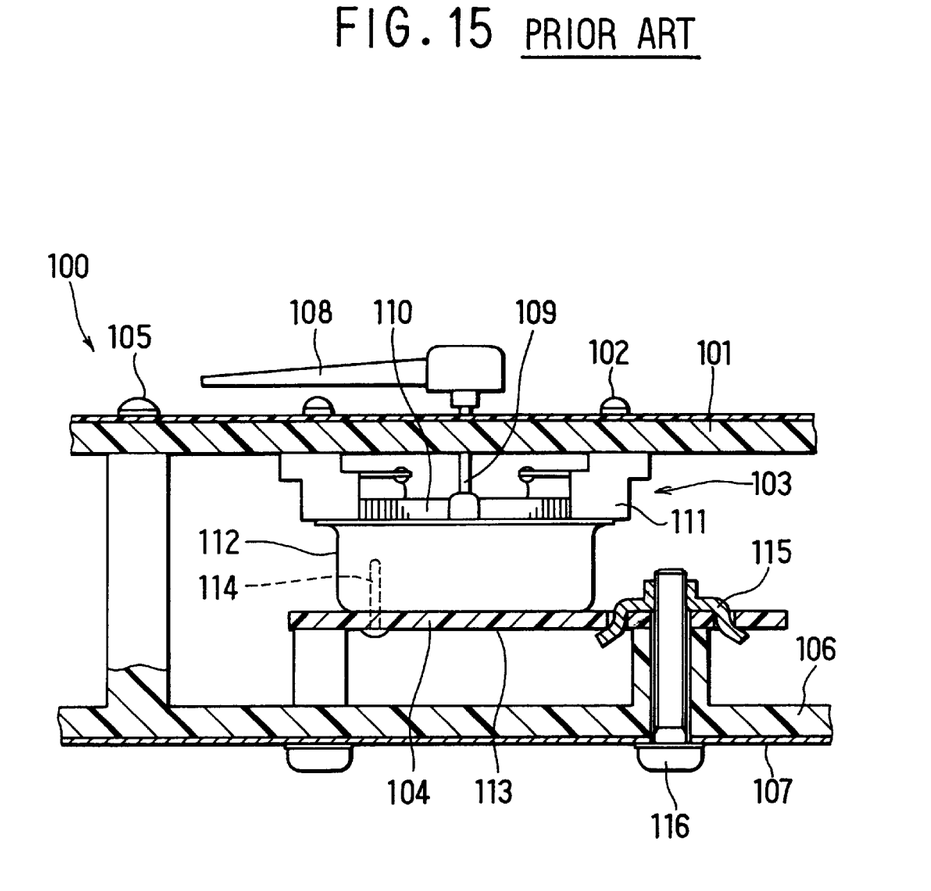
FIG. 15 is a cross-sectional view of a part of a meter according to the prior art.

As shown in FIG. 15, a conventional meter 100 for a vehicle is composed of a dial plate 101, a driving unit 103 fixed to the back of the dial plate 101 by a plurality of screws 102, a printed circuit board 104 fixed to the driving unit 103, a meter case 106 to which the dial plate and the printed circuit board 104 are fixed by screws 105 and a printed circuit pattern 107 fixed to the back of the meter case 106. The driving unit 103 has a shaft 109 for driving a pointer 108, a pair of cross coils 110 wound on a bobbin and a housing 112 for accommodating the above members. In order to connect the driving unit 103 to the printed circuit pattern 113 formed on the circuit board 104, one end of a pin 114 is inserted into a female connector terminal (not shown) of the driving unit 103 and the other end is soldered to the printed circuit pattern 113. The circuit board 104 is fixed to the meter case 106 by a terminal plate 115 and screws 116 so that the driving unit 103 is also connected to a printed circuit pattern 107.

Because of variations in the axial size of the driving unit 103 and, also, differences in the coefficient of the thermal expansion between the printed circuit board 104 and the meter case 106, the relative position between the back of the driving unit 103 and the printed circuit pattern 107 can not be accurately maintained. As a result, the driving unit may be deformed or distorted to the extent that it fails to drive the pointer accurately or may not be connected to the circuit pattern 107 completely if they are forcibly assembled.

In order to solve the above problem, JP-A-8-152438 proposes a meter for a vehicle which is provided with a coil bobbin having flanges supporting male terminals and a printed circuit board having female terminals. The electric connection is made only by inserting the male terminals into the female terminals. The male terminals are held by blade springs so that they can move relative to the flanges without interruption of the electrical connection.

Although the female terminals are fixed to the printed circuit board, the male terminals are not fixed to the driving unit. Accordingly, the male terminals are apt to move when one intends to insert the male terminals into the female terminals. If the meter is a cross-coil type, four male terminals must be inserted into corresponding female terminals and, therefore, the assembling process is troublesome.

SUMMARY OF THE INVENTION

The object of the present invention is to provide an improved electric connector arrangement which has fixed male and female terminals and which is easy to connect two electric devices without deformation or distortion.

According to a main feature of the present invention, an electric connector arrangement for connecting two devices comprises a fixed male terminal and a fixed female terminal, and the fixed female terminal has a deformable portion readily deforming to receive the male terminal without applying stress to the electric devices. Therefore, two devices can be connected easily without deformation.

According to another feature of the present invention, the female terminal may be composed of a U-shaped contact portion inserted into an opening of the other device to establish electric connection. Therefore, the connection process is very simple.

According to another feature of the present invention, the female terminal may have a hook portion for positioning the female terminal in the other of the electric device correctly.

According to another feature of the present invention, the female terminal may have a portion to be pushed when it is fixed to an electric device.

According to another feature of the present invention, the female terminal is composed of a body portion fixed to an electric device, an elastic female contact for receiving the male terminal, and a U-shaped deformable portion extending from the body portion readily deforming.

According to another feature of the present invention, a method of assembling an electric connector arrangement into a printed circuit board is provided. In the method, the female terminal includes a body portion to be fixed to the printed circuit board, an elastic female contact for receiving the male terminal and a U-shaped deformable portion extending from the body portion readily deforming. The method is composed of steps of forming a connecting slit in the printed circuit board, inserting the U-shaped deformable portion into the slits while the body portion is lifted from the printed board, pushing the body portion to insert the same into the opening, thereby bending the U-shaped deformable portion, and inserting the male terminal into the female terminal.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

First Embodiment

An electric connector arrangement according to a first embodiment of the present invention is described with reference to FIGS. 1–6.

Figure 1:
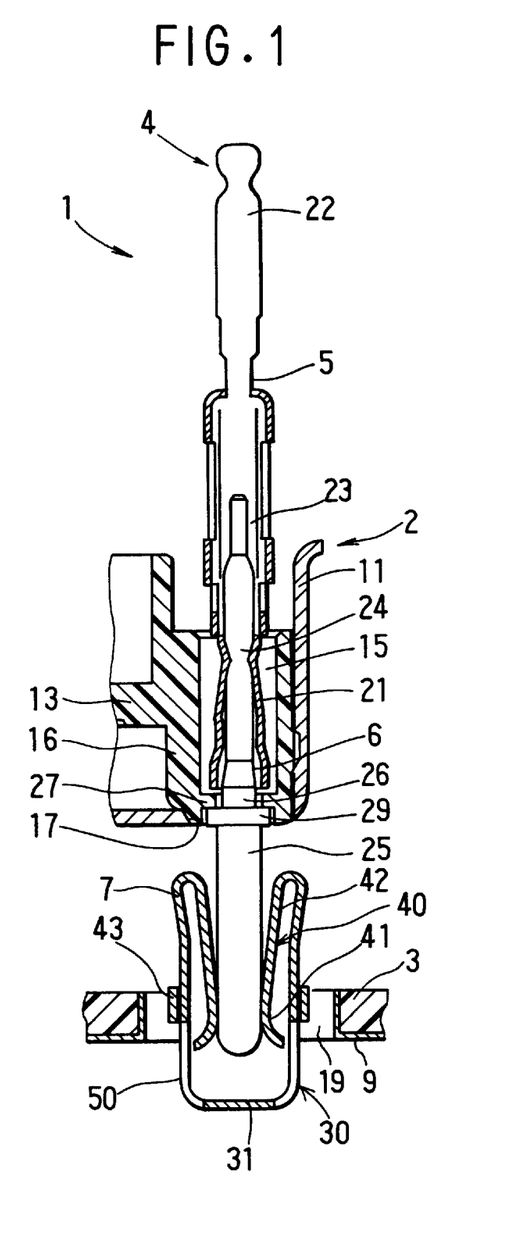
FIG. 1 is a cross-sectional front view illustrating an electric connector arrangement according to a first embodiment of the present invention.
Figure 2:
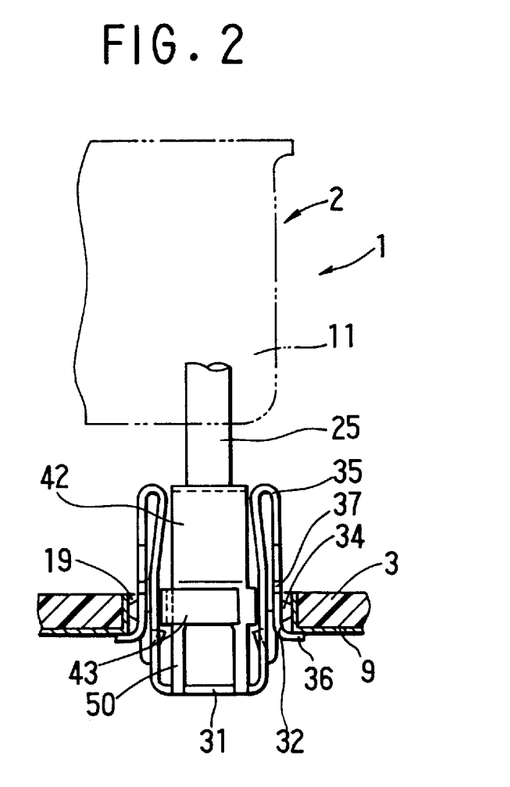
FIG. 2 is a cross-sectional side view illustrating the electric connector arrangement according to the first embodiment.

A meter for a vehicle 1 is composed of one or more driving unit or units 2, a printed circuit board 3 and an electric connector arrangement 4.

The driving unit 2 is composed of a cylindrical sealed case 11, a moving magnet (not shown) which is connected to a rotary shaft 12, a coil bobbin 13 which accommodates the moving magnet and a pair of cross coils 8 for driving the moving magnet.

The coil bobbin 13 is made of poly-butylene terephthalate (PBT) and has four stays 14 (shown in FIG. 3) extending outward from the peripheral portions thereof. The stays 14 of the coil bobbin 13 are fixed to the back of a dial plate by screws or the like. The coil bobbin 13 has a plurality of terminal holders 16, in which through holes 15 extend in the direction parallel with the shaft 12. Each of the terminal holders 16 has a cylindrical projection fitted to one of holes 17 formed at the bottom of the sealed case 11.

The printed circuit board 3 has a printed circuit pattern 9 formed on the back and the inner surface of an opening 19 and is fixed to the meter case by screws at a space of about 6 mm to 7 mm from the back of the driving unit 2. The printed circuit pattern 9 includes resistors, capacitors and coils, forming a driving circuit for the rotary shaft 12 of the driving unit 2.

The electric connector arrangement 4 is composed of an internal female terminal 5 connected to the cross coils 8 of the driving unit 2, a male terminal 6 connected to the printed circuit pattern 9 and an external female terminal 7 connected to the printed circuit pattern formed on the printed circuit 3.

Figure 3:
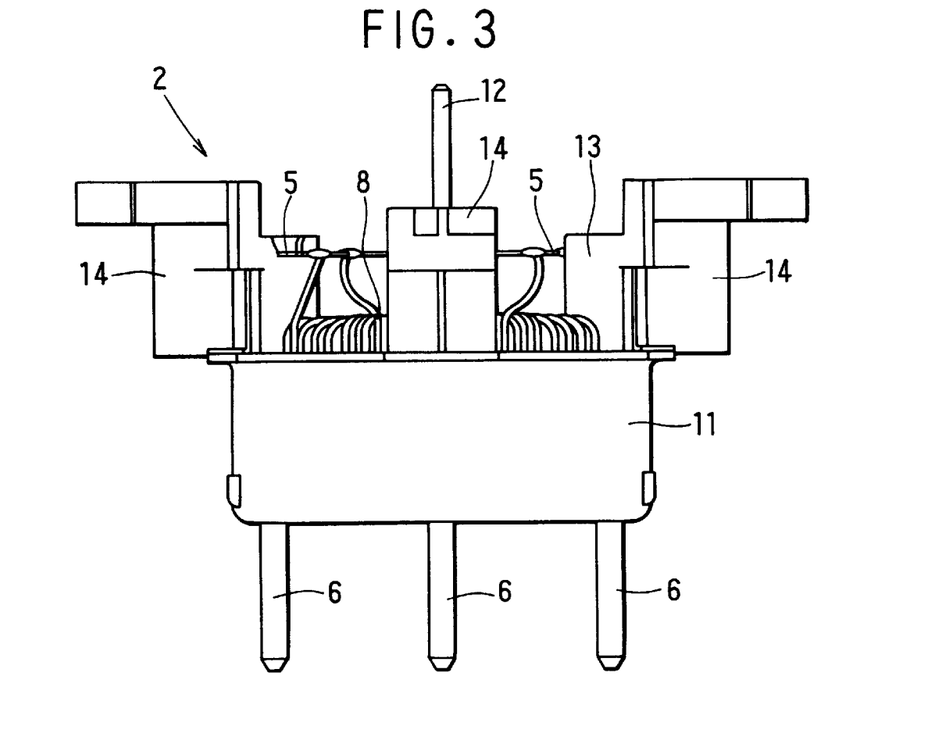
FIG. 3 is a front view illustrating a driving unit of a meter for a vehicle which has male terminals according to the first embodiment.

The internal female terminal 5 is made of a conductive metal plate such as copper alloy and has a female contact 21 inserted in the through hole 15 of one of the terminal holders 16 of the coil bobbin 13, a connection plate 22 extending from an upper portion of the coil bobbin 13 and a connecting portion 23 for connecting the female contact 21 and the connection plate 22. Each connection plate 22 is bent at right angle and soldered to one of leads of the cross coil 8 as shown in FIG. 3. Each female contact 21 receives one of male terminals 6 therein by the spring action thereof.

Each of the male terminals 6 has a contact portion 24 inserted in the female contact 21, a contact portion 25 inserted in an external female terminal 7 and a connecting portion 26. The contact portion 25 has an outside diameter larger than that of the contact portion 24. A flange portion 29 is formed on the connecting portion 26 to be held by an annular projection 27 formed on the terminal holder 16. The flange portion 29 prevents the male contact portion 25 from extending into the inside of the driving unit 2 excessively.

As described in FIGS. 1, 2, 4, FIGS. 5A–5C and FIGS. 6A and 6B, the external female terminal 7 is made of conductive metal plate such as a copper alloy plate and has a body portion 30 fitted into an opening 19 of the printed circuit board 3, a pair of female contacts 40 disposed inside the body portion 30 and a deformable connecting portion 50.

The body portion 30 has a rectangular bottom portion 31, a pair of contact members 32 extending from opposite sides of the rectangular bottom portion 31 through the opening 19. The bottom portion 31 is pushed when the external female terminal 7 is inserted into the opening 19 of the printed circuit board 3 so that it covers the tip of the male terminal 4 (contact portion 25). Each of the contact members 32 has a projection 34, a U-shaped spring portion 35 which presses the projection 34 against the printed circuit pattern 9 in the opening 19, an L-shaped hook portion 36, a pair of shoulder portions 37, a pair of arm portions 38 and a projection 39.

Figure 4:
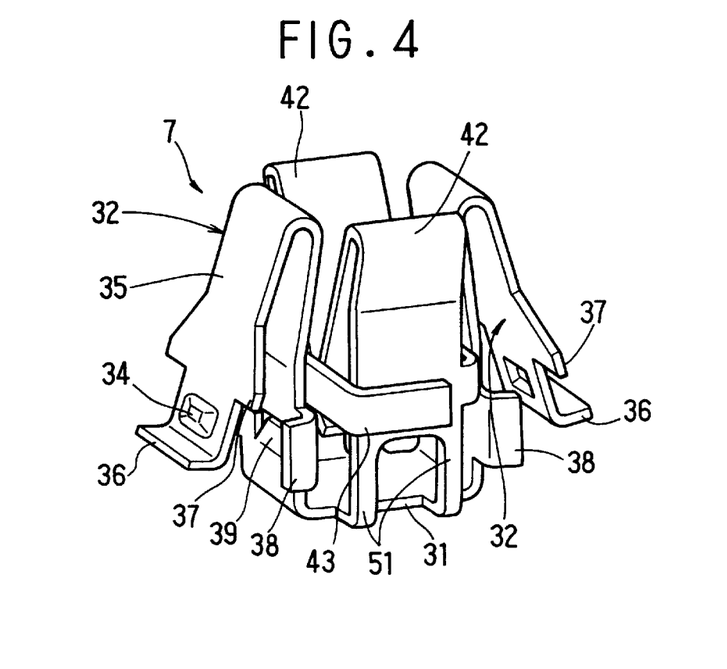
FIG. 4 is a perspective view illustrating a female terminal according to the first embodiment.
Figure 5A:
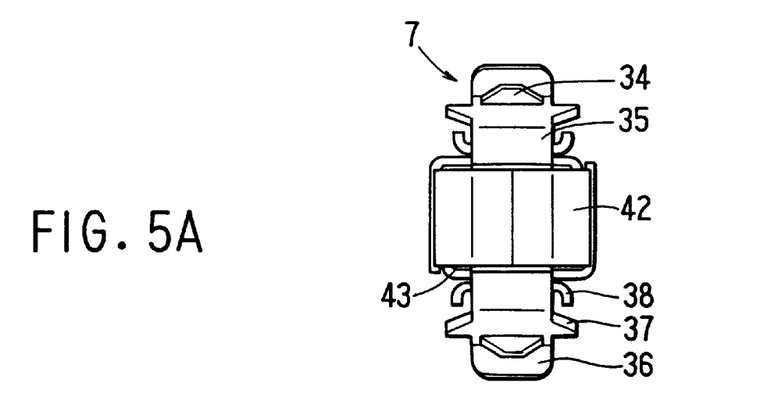
FIG. 5A is a top view illustrating the female terminal according to the first embodiment.
Figure 5B:
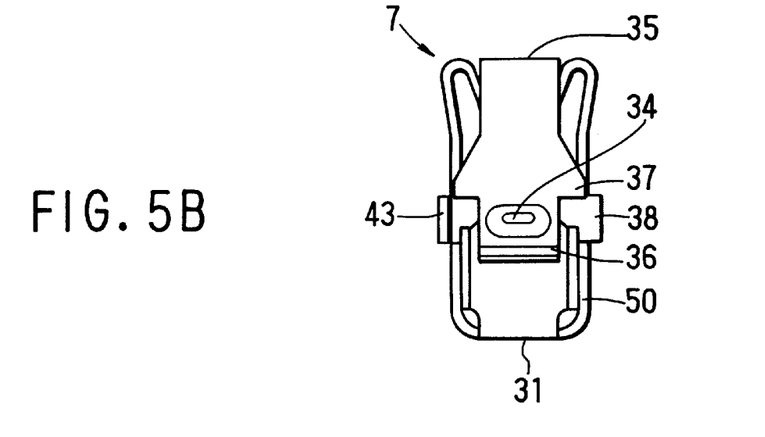
FIG. 5B is a front view illustrating the female terminal according to the first embodiment.
Figure 5C:
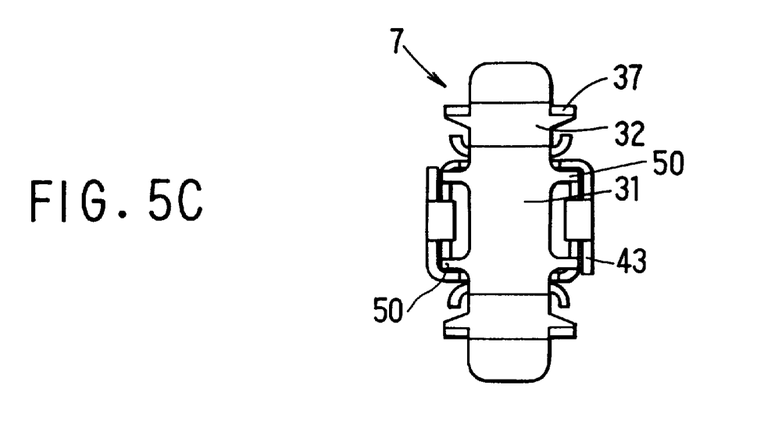
FIG. 5C is a bottom view illustrating the female terminal according to the first embodiment.
Figure 6A:
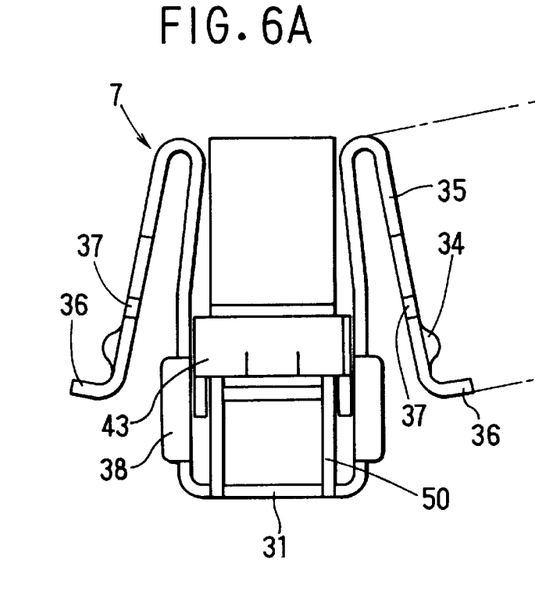
FIG. 6A is a side view illustrating the female terminal according to the first embodiment.
Figure 6B:
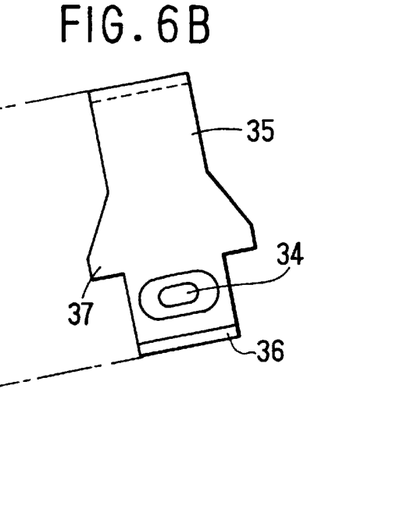
FIG. 6B is a front view illustrating a contact plate of the female terminal according to the first embodiment.

When the outside female terminal 7 is inserted into the opening 19 of the printed circuit board 3, the hook portions 36 engage edges of the opening 19 to position the female terminal 7 correctly. On the other hand, the shoulder portions 37 engages edges of the opening from the opposite direction to maintain the position thereof when the male terminal 6 is inserted into the external female terminal 7. The arm portions 38 restrict excessive bending of the U-shaped spring portion 35, and the projection 39 prevents buckling of the female contacts 40.

A pair of the female contacts 40 extend from opposite sides of the rectangular bottom portion 30 between the contact members 32. Each of the female contacts 40 has a convex contact portion 41 at the edge thereof, a U-shaped spring portion 42 for biasing the contact portion against the outer periphery of the male terminal 6, an L-shaped arm portion 43 which holds other female contact from the back and an deformable fork portion 50 having two elastic legs extending from the bottom portion 31. When the male terminal 6 is inserted in the space between the convex contact portions 41, the arm portions 43 ensure a sufficient contact pressure. The fork portions 50 can deform so that the female contacts 40 can move as desired without applying distorting stress to the driving unit 2 or the male terminal 6.

After the driving unit 2 is assembled, the internal female terminals 5 are inserted into the terminal holders 16. The connection plates 22 are bent about 90 degree in angle and soldered to corresponding lead wires of the cross coils 8. Thereafter, the male terminals 6 are inserted into the internal female terminals 5 until the flange portions 29 engage the annular projecting portions 27. Then, the external female terminals 7 are inserted into the openings 19 of the printed circuit board 3 with the U-shaped spring portions 35 and 42 being at the head until the hook portions 36 engage the edges of the openings 19. In this stage, the shoulder portions 37 project from the upper surface of the printed circuit board 3 and engage the upper edges of the openings 19 with a gap between 0.1 mm and 1 mm.

When the driving unit 2 with the male terminal 6 is, subsequently, assembled to the printed circuit board 3, the contact portions 25 are inserted to the female terminal 7 from above as shown in FIG. 1 until the shoulder portions 37 engage the upper edges of the openings to be in full contact with the convex contact portions 41 of the female contacts 40. Thus, the cross coils 8 of the driving unit 2 are properly connected to the printed circuit pattern 9.

The printed circuit board 3 is fixed to the meter case by a plurality of screws and the stays 14 of the coil bobbin 13 are fixed to the back of the dial plate by a plurality of screws. If the driving unit 2 is not positioned correctly relative to the printed circuit board 3 due to heat expansion or some other reason, the female contacts 40 of the external female terminals 7 are flexible enough to deform and absorb stresses otherwise applied to the driving unit 2.

Since the male terminals 6 are fixed to the driving unit and the external female terminal 7 are fixed to the printed circuit board 3, the connecting work is easy.

Second Embodiment

Figure 7:
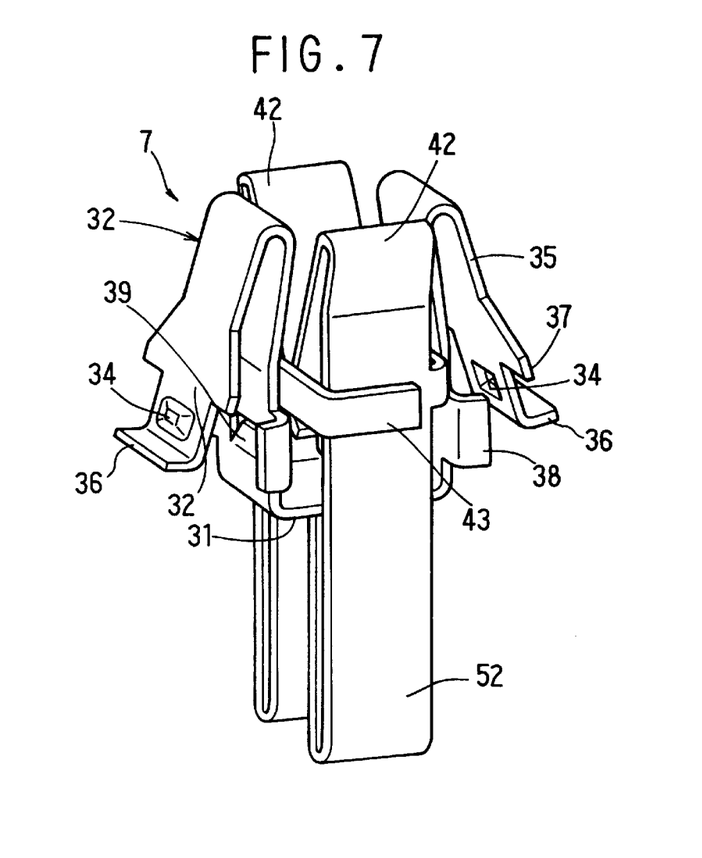
FIG. 7 is a perspective view illustrating a female terminal according to a second embodiment of the present invention.

An electric connector arrangement according to a second embodiment is described with reference to FIG. 7.

The fork portions 50 according to the first embodiment are replaced with a pair of elongated U-shaped spring portions 52. Other portions are substantially the same.

If the relative position between the driving unit 2 and the printed circuit board 3 varies, the U-shaped spring portions deform and absorb the variation.

Third Embodiment

Figure 8:
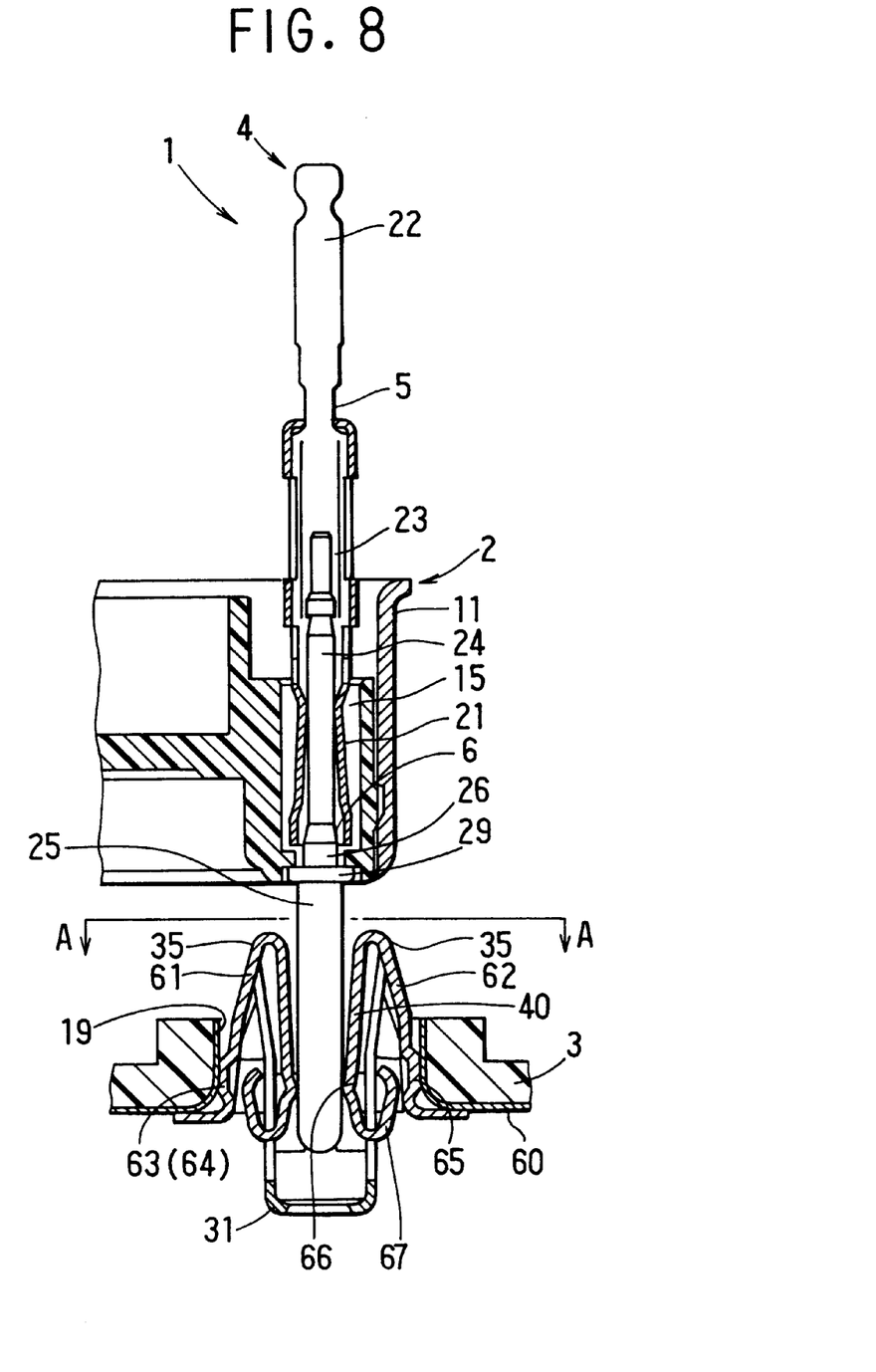
FIG. 8 is a cross-sectional front view illustrating an electric connector arrangement according to a second embodiment of the present invention.
Figure 9:
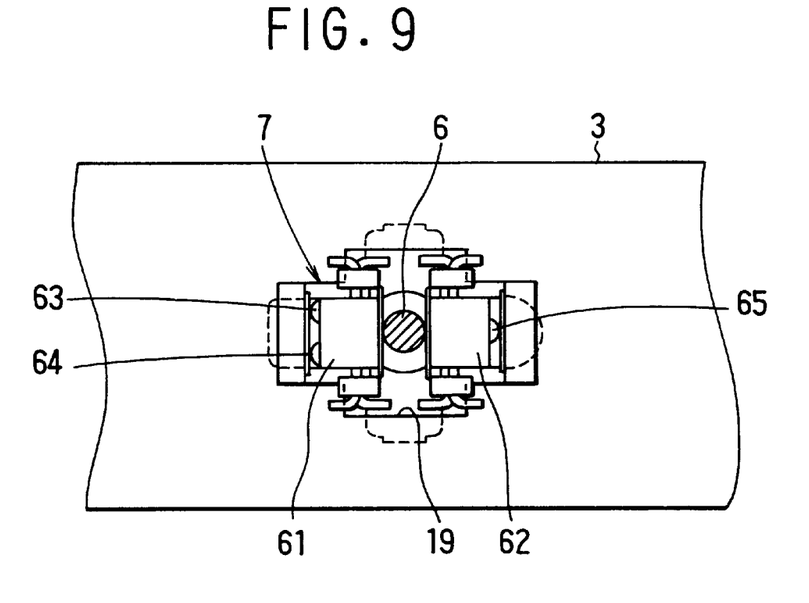
FIG. 9 is a cross sectional view cut along a line indicated by arrows A in FIG. 8.
Figure 10:
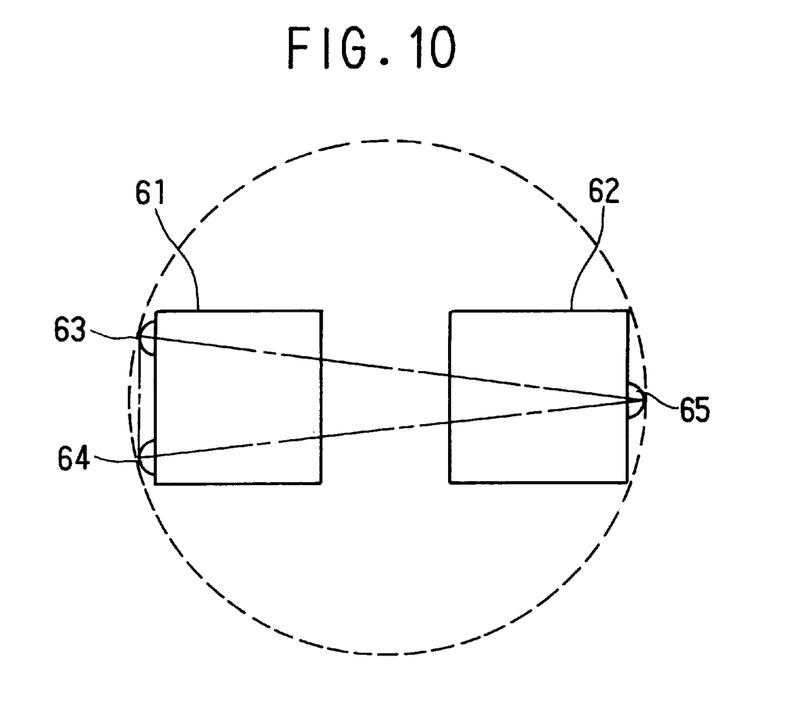
FIG. 10 is a diagram showing disposition of projections according to a third embodiment of the present invention.

An electric connector arrangement according to a third embodiment is described with reference to FIGS. 8–10, in which the same reference numerals as those of the first embodiment correspond to the same or substantially the same parts or components.

A flexible printed-circuit-film 60 is fixed to the printed circuit board 3. The opening 19 is cross-shaped, as shown in FIG. 9.

The external female terminal 7 has a pair of contact members 61 and 62. The contact member 61 has a pair of projections 63 and 64 and the contact member 62 has one projection 65. The projections 63–65 are in contact with portions of the flexible printed-circuit-film disposed in the opening 19. Each of the projections 63–65 is disposed at one of the apexes of an isosceles triangle as shown in FIG. 10. The female contacts 40 have the U-shaped spring portions 42 which have projections 66 and 67 in contact with the male terminal 6.

The three projections 63–65 ensure stable contact of the contact members 61 and 62 to the flexible printed-circuit-film 60.

Fourth Embodiment

An electric connector arrangement according to a fourth embodiment is described with reference to FIGS. 11–14, in which the same reference numerals as those of the first embodiment correspond to the same or substantially the same parts or components.

Figure 11:
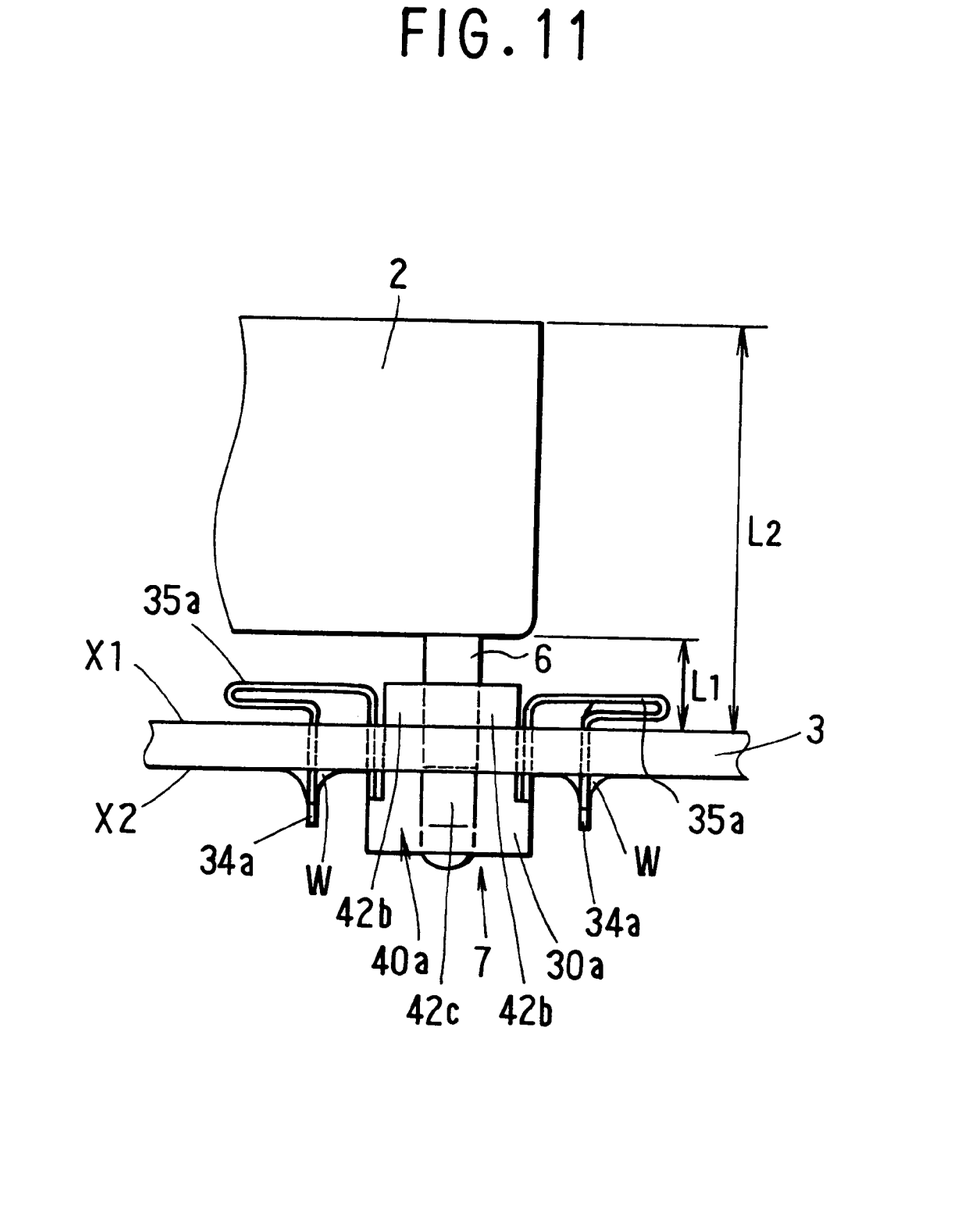
FIG. 11 is a side view illustrating an electric connector arrangement according to a fourth embodiment of the present invention.
Figure 12:
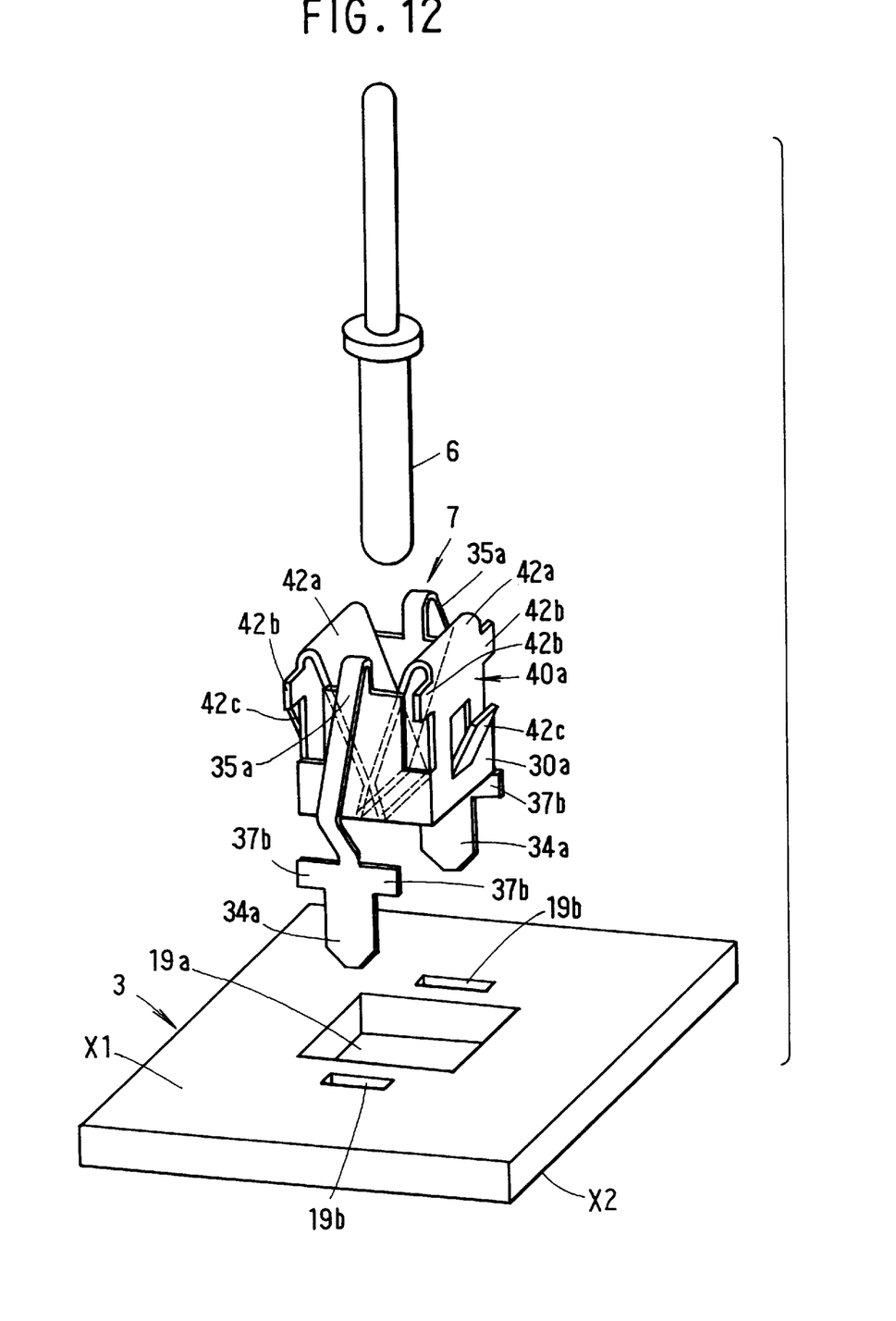
FIG. 12 is an exploded perspective view illustrating parts before assembling the connector arrangement according to the fourth embodiment.

The printed circuit board 3 has a surface X1 facing the driving unit 2 and the opposite surface X2 on which the female terminal 7 is soldered to the circuit pattern (not shown).

The female terminal 7 is composed of a pair of female contacts 40a, a pair of thin U-shaped connecting portions 35a which extend outward therefrom, a pair of contact tips 34a soldered to the printed circuit board 3, and a rectangular body portion 30a which connects the female contacts 40a to the contact tips 34a.

The printed circuit board 3 has an opening 19a for receiving the female contact 40a therein and a pair of slits 19b to which the contact tips 34a are inserted. The body portion 30a has a pair of U-shaped spring portions 42a extending from the upper end thereof into the inside thereof to receive the male terminal 6 therebetween. The body portion 30a has two pair of shoulder portions 42b and a pair of resilient hook portions 42c which are cut and lifted from the side wall thereof.

Figure 14:
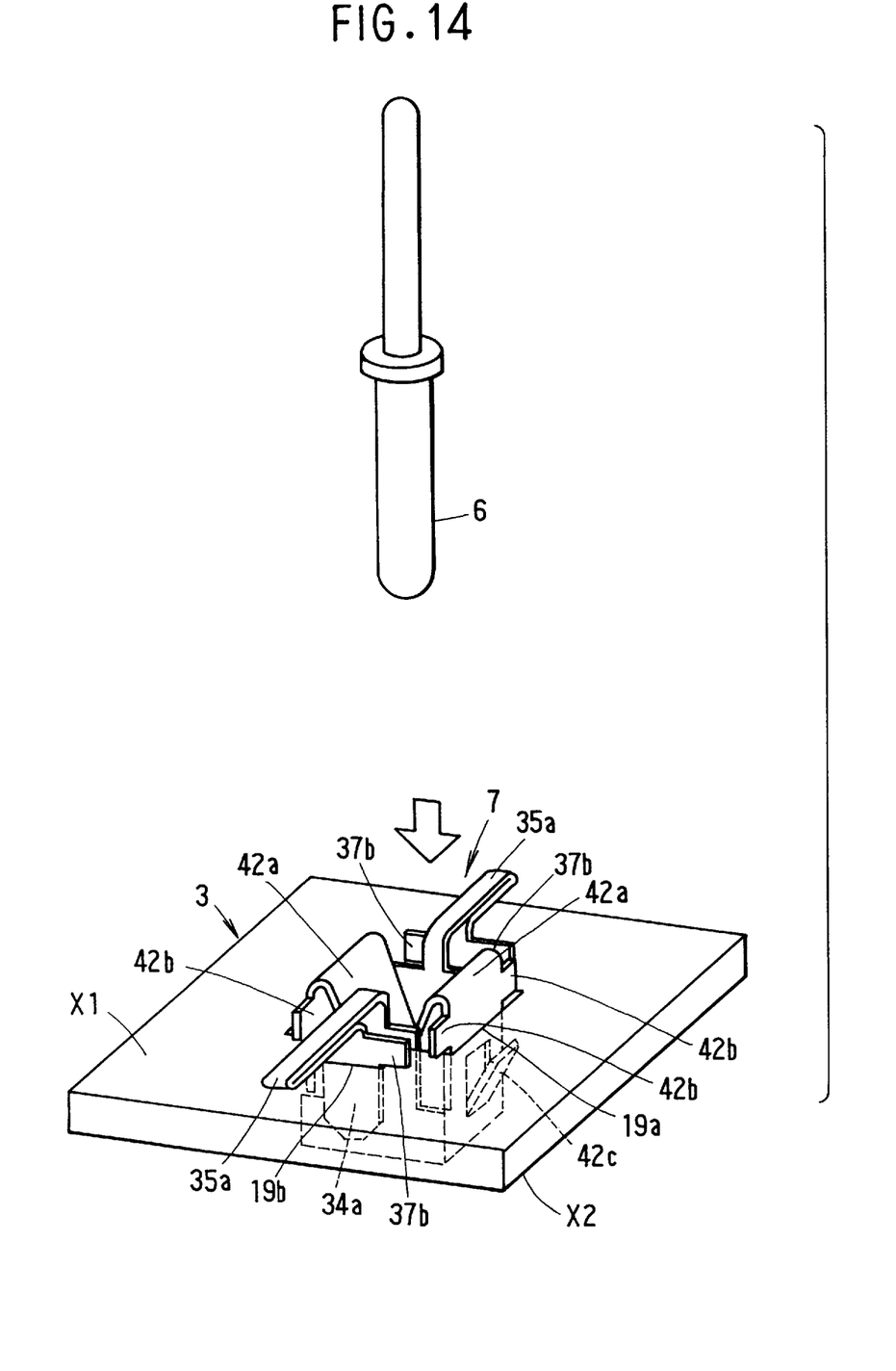
FIG. 14 is an exploded perspective view illustrating parts in assembling the connector arrangement illustrated in FIG. 12.

The shoulder portions 42b abut the surface X1 of the printed circuit board 3 near the opening 19a, as shown in FIG. 14, to retain the female contact 40a in the normal position or depth. The resilient hook portions 42c are formed at wall portions of the body portion 30a lower than the shoulder portions 42b. The hook portions 42c abut the opposite surface X2 near the opening 19a to prevent the female contact 40a from leaving the opening 19a.

Figure 13:
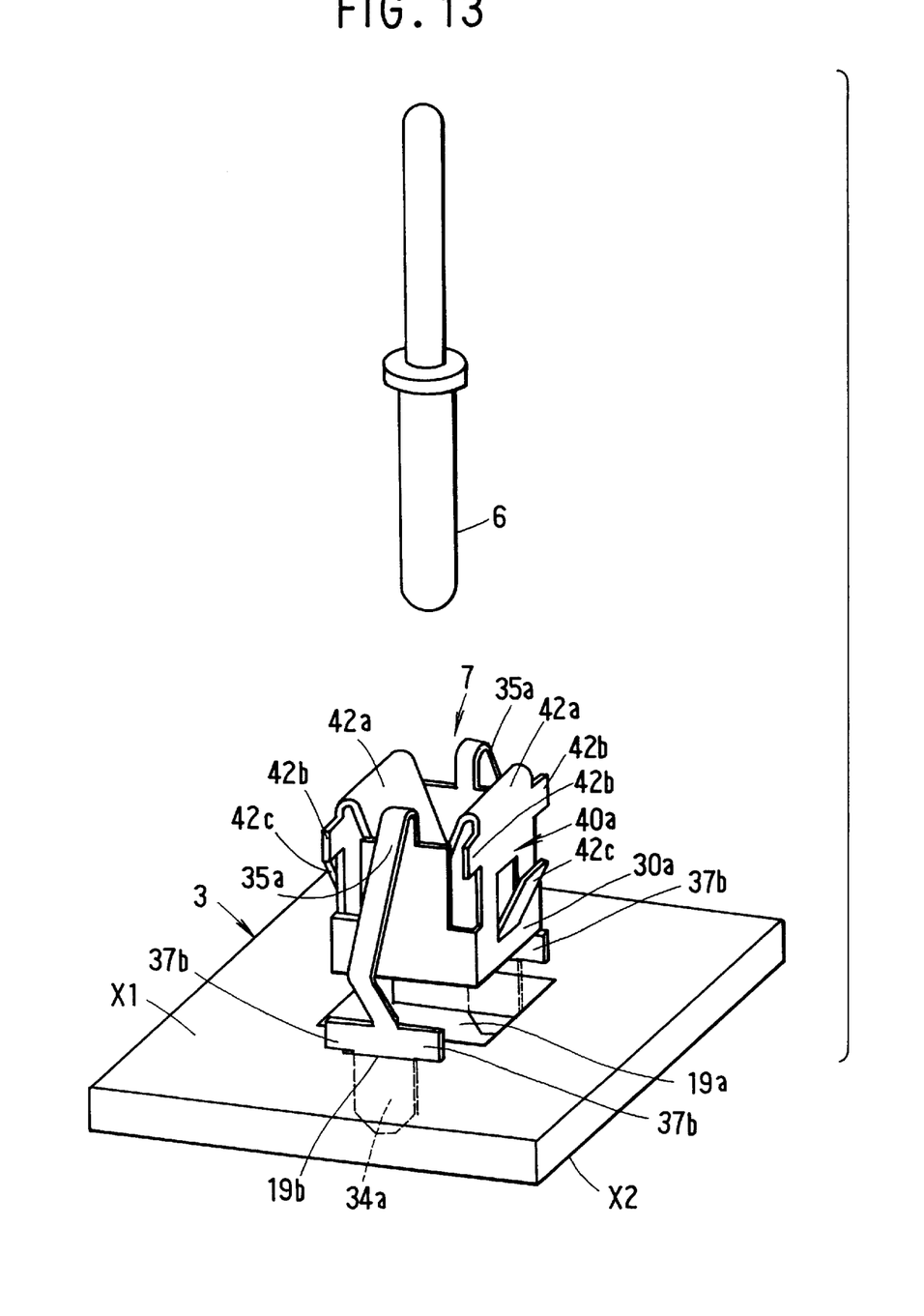
FIG. 13 is an exploded perspective view illustrating parts in assembling the connector arrangement illustrated in FIG. 12.

Each of the U-shaped connecting portions 35a extends from the upper end of the body portion 30a outward and downward has a bent portion in the middle thereof so that the bent portion can be deformed from the state shown in FIGS. 13 to the state shown in FIG.14 when an excessive pressure is applied.

Each of the contact tips 34a has a pair of shoulder portions 37b, which abut the surface X1 around one of the slits 19b to place the contact tips 34a at the normal position or depth. The contact tips 34a are soldered to the circuit pattern on the surface X2.

In order to connect the contact tips 34a to the printed circuit 3, the female terminal 7 is placed on the surface X1. Then, the tip portions 34a are inserted into the slits 19b while the female contact 40a is separated from the printed circuit board 3 as shown in FIG. 13. Then, the tips 34a and the circuit pattern on the surface X2 of the printed circuit board 3 are dipped in melted solder. At this time, other portions of the female contact 40a is placed high enough from the melted solder. Thereafter, the female terminal 7 is pressed down as indicated by an arrow in FIG. 14 to deform the U-shaped connecting portions 35a, so that the female contact 40a is inserted into the opening 19a. The hook portions 42c are pressed and flattened by the inner periphery of the opening 19a as they get into the opening 19a until the upper ends of the hook portions 42c come out of the opening 19a. When the hook portions 42c are positioned below the surface X2, they rise up to the original state so that the upper ends thereof abut portions of the surface X2 near the opening 19a. At the same time, the shoulder portions 42b come to abut the portions of the surface X1 around the slits, as shown in FIG. 14. Then, the male terminal 6 is inserted into the space between the two U-shaped spring portions 42a, as shown in FIG. 11.

The printed circuit pattern can be disposed on the surface X1.

The flexible printed-circuit-film can be replaced with other kind of printed circuit board or film. The connector arrangement described above can be applied to various devices other than the meter.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. An electric connector arrangement for connecting first and second electric devices comprising:

a male terminal fixed to said first electric device and extending therefrom toward said second electric device;

a circuit board fixed to said second electric device and having an insertion opening and at least one slit;

a female terminal for receiving said male terminal therein, said female terminal having a body portion being movable between a first position in which said body portion is outside of said insertion opening and a second position in which said body portion is inserted into said insertion opening;

wherein said female terminal comprises:

an elastic female contact for receiving said male terminal; and at least one deformable connecting element extending away from said body portion and inserted in said slit, wherein said at least one deformable connecting element extends below said body portion when said body portion is in its said first position; and wherein said at least one deformable connecting element is in a U-shape when said body portion is in its said second position.

2. An electric connector arrangement as claimed in claim 1, wherein said female contact has engagement means associated with said second electric device for positioning said body portion relative to said first electric device.

3. An electric connector arrangement as claimed in claim 2, wherein said engagement means comprises a shoulder portion for positioning said body portion at a normal depth and a hook portion for preventing said body portion from disconnecting from said second electric device.

4. The electric connector arrangement as claimed in claim 1, wherein each of said connecting elements have first and second connecting legs which extend substantially parallel to each other and perpendicularly away from said body portion when said body portion is in its said second position.

5. The electric connector arrangement as claimed in claim 1, wherein said circuit board has a surface having a circuit pattern and said contact tips are soldered to said circuit pattern.

6. The electric connector arrangement as claimed in claim 1, wherein said body portion extends through said insertion opening from a side of said circuit board opposite said circuit pattern when said body portion is in its said second position.

7. A method of assembling an electric connector arrangement into a printed circuit board having an opening for receiving a female terminal which receives a male terminal fixed to an electric device, said female terminal including a body portion to be fixed to said printed circuit board, an elastic female contact for receiving said male terminal and at least one deformable element extending from said body portion and having a length which extends beyond a length of said body portion, wherein said method comprises:

forming at least one slit, separate from said opening, in said printed circuit board;

inserting said at least one deformable element into said at least one slit while said body portion is elevated by said deformable element from said printed circuit board and soldering said deformable element to said printed circuit board;

inserting said body portion into said opening, thereby bending said deformable element into a U-shape; and inserting said male terminal into said female terminal.

* * * * *